US009159599B2

(12) United States Patent
Ansell et al.

(10) Patent No.: US 9,159,599 B2
(45) Date of Patent: Oct. 13, 2015

(54) APPARATUS FOR CHEMICALLY ETCHING A WORKPIECE

(75) Inventors: Oliver Ansell, Berkeley (GB); Anthony Barrass, Thornbury (GB); Paul Bennett, Bristol (GB); David Tossell, Bristol (GB)

(73) Assignee: SPTS Technologies Limited, Newport, Wales (GB)

( * ) Notice: Subject to any disclaimer, the term of this patent is extended or adjusted under 35 U.S.C. 154(b) by 553 days.

(21) Appl. No.: 12/722,614

(22) Filed: Mar. 12, 2010

(65) Prior Publication Data

US 2010/0230049 A1 Sep. 16, 2010

(51) Int. Cl.
*H01L 21/67* (2006.01)
*H01J 37/32* (2006.01)

(52) U.S. Cl.
CPC ....... *H01L 21/67253* (2013.01); *H01J 37/3299* (2013.01); *H01J 37/32917* (2013.01); *H01J 37/32935* (2013.01); *H01J 37/32963* (2013.01); *H01J 37/32972* (2013.01); *H01J 37/32981* (2013.01)

(58) Field of Classification Search
CPC .......... H01L 21/02046; H01L 20/02085; H01L 21/02301; H01L 21/0234; H01L 21/67069; H01L 21/67253; H01L 21/67259; H01L 21/681; H01L 37/244; H01L 37/3299; H01L 37/32963; H01J 37/32981; H01J 37/32935; H01J 37/32972; H01J 37/32917
USPC .......... 156/345.24, 345.25; 118/715
See application file for complete search history.

(56) References Cited

U.S. PATENT DOCUMENTS

| 4,857,136 | A | * | 8/1989 | Zajac | 438/16 |
| 5,290,383 | A | * | 3/1994 | Koshimizu | 156/345.25 |
| 5,986,747 | A | * | 11/1999 | Moran | 356/72 |
| 6,207,008 | B1 | | 3/2001 | Kijima | |
| 6,366,346 | B1 | | 4/2002 | Nowak et al. | |
| 6,592,817 | B1 | * | 7/2003 | Tsai et al. | 422/62 |
| 7,201,174 | B2 | * | 4/2007 | Fukiage | 134/1.1 |
| 2002/0139477 | A1 | * | 10/2002 | Ni et al. | 156/345.44 |
| 2003/0194495 | A1 | | 10/2003 | Li et al. | |
| 2003/0232495 | A1 | * | 12/2003 | Moghadam et al. | 438/623 |
| 2006/0290925 | A1 | | 12/2006 | Nomine et al. | |
| 2008/0041415 | A1 | | 2/2008 | Demos et al. | |

(Continued)

FOREIGN PATENT DOCUMENTS

| JP | H03147318 A | 6/1991 |
| JP | H08218186 A | 8/1996 |
| JP | 9-209179 | 8/1997 |
| WO | 0017901 A1 | 3/2000 |

OTHER PUBLICATIONS

IPO Search Report dated Jul. 2, 2009 in GB application No. GB0904240.9.

*Primary Examiner* — Jeffrie R Lund
(74) *Attorney, Agent, or Firm* — Volentine & Whitt, PLLC

(57) ABSTRACT

Apparatus for chemically etching a workpiece includes a chamber for receiving a process gas and having a pumping port for extracting exhaust gases, and a workpiece support located in the chamber upstream of the pumping port. The chamber further includes a sub-chamber located upstream of the pumping port and downstream of the workpiece support, and the sub-chamber includes a window and an excitation source, adjacent the window, for creating a plasma in a sample of the exhaust gases to create an optical emission which can be monitored through the window.

17 Claims, 3 Drawing Sheets

(56) References Cited

U.S. PATENT DOCUMENTS

| | | | |
|---|---|---|---|
| 2008/0176149 A1* | 7/2008 | Grimbergen | 430/5 |
| 2009/0035945 A1* | 2/2009 | Fujii et al. | 438/758 |
| 2009/0104761 A1* | 4/2009 | Jeon et al. | 438/513 |
| 2010/0224322 A1* | 9/2010 | Sui et al. | 156/345.25 |
| 2010/0230049 A1* | 9/2010 | Ansell et al. | 156/345.24 |
| 2011/0222058 A1* | 9/2011 | Kim et al. | 356/316 |
| 2012/0288969 A1* | 11/2012 | Nakao et al. | 438/9 |

* cited by examiner

APPARATUS FOR CHEMICALLY ETCHING A WORKPIECE

BACKGROUND

This invention relates to apparatus and methods for chemically etching a workpiece using a process gas.

It has been known for many decades that when plasma etching a workpiece, it is possible to detect the point at which an etch has cut through a first layer and reached the underlying layer by the change in the optical emission resulting from the change in the exhaust or reaction products being generated and then being ionized by the plasma. Endpoints can also be detected by changes in consumption of etch gas, which can also be detected optically. Initially these emissions were monitored by skilled technicians. Subsequently the process was automated using optical end point detectors.

Endpoint processes based on the first part approach can only work where there is a plasma being generated and the exhaust and reaction products enter the plasma. There have been, accordingly, a number of proposals, such as that described in U.S. Pat. No. 4,857,136, in which the exhaust products from the turbo pump are ionized and the resultant optical emissions monitored. Experience has shown that arrangements of this sort can have a sluggish response and repeatedly is difficult to achieve due to limitations in local conditions.

SUMMARY

From one aspect the invention consists in apparatus for chemically etching a workpiece using a process gas, the apparatus including a chamber for receiving a process gas and having a pumping port for extracting exhaust gases; and a workpiece support located in the chamber upstream of the pumping port characterized in that the chamber further includes a sub-chamber located upstream of the pumping port and downstream of the workpiece support and in that the sub-chamber includes a window and an excitation source, adjacent the window, for creating a plasma in a sample of the exhaust gases to create an optical emission which can be monitored through the window.

The sub-chamber may include an extension or dead end in which the window is formed and the excitation source may include a coil located around the extension or dead end. The window is preferably close to the pumping port and may, for example, be opposite the pumping port. This enables the window to be adjacent to the exhaust stream.

The apparatus may further include a detector for monitoring the optical emission visible through the window and may further include a control for determining a process end point from the detected optical emission.

The apparatus may further include a source for supplying ionized process gas. Additionally or alternatively it may include a plasma source for creating a plasma in the chamber.

The invention also includes a method of etching using the apparatus defined above wherein the pressure in the chamber during etching is between about 1 to 500 mTor.

Although the invention has been described above it is to be understood it includes any inventive combination of the features set out above or in the following description.

BRIEF DESCRIPTION OF THE DRAWINGS

The invention may be performed in various ways and a specific embodiment will now be described, by way of example, with reference to the accompanying drawings, in which.

DETAILED DESCRIPTION OF EMBODIMENTS

Figure 1:
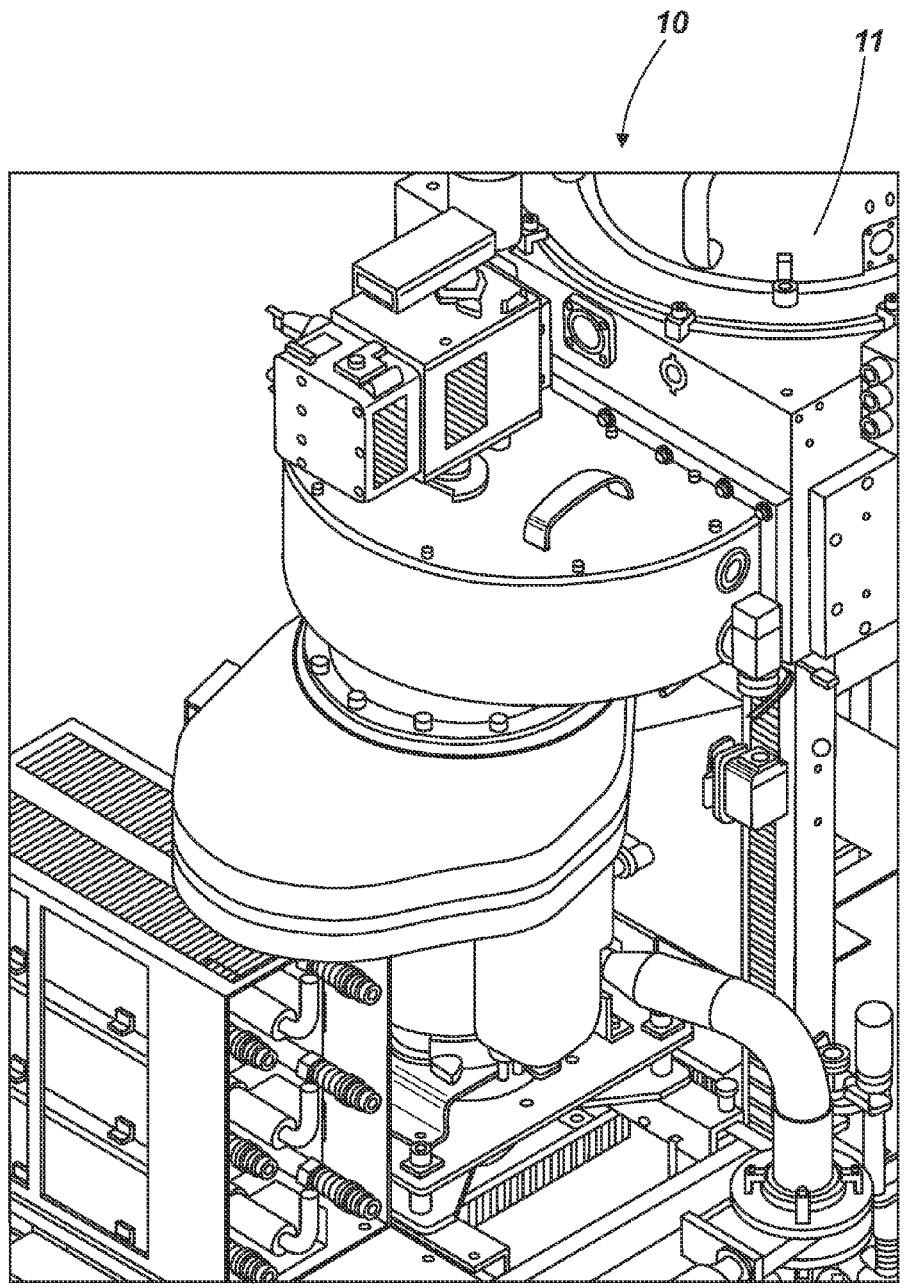
FIG. 1 is a photograph of part of an etch apparatus.

An etching apparatus is generally indicated at 10 and has a chamber 11, in which is located a workpiece support 12, which is conveniently in the form of a electrostatic chuck, and a source of ionized process gas generally indicated at 13. In a typical prior art arrangement such an apparatus would have a pumping port located at 14, which would be connected to a turbo pump. In the applicants arrangement a sub-chamber 15 is attached to the opening 14 and carries a pumping port 16 which is connected to a turbo pump 17.

The sub-chamber 15 is also provided with an extension or dead end 18 that has a window 19 formed in its closed end. A coil 20 surrounds the extension 18 and is connected to a RF source 21 so that a local plasma can be struck within the extension 18.

A detector 22 is located outside the window 19 to monitor the optical emissions from the localized plasma 23 and it feeds it output signals to a control/processor 24, which produces an output signal 25 that can be used to control the process within the chamber 11 and may be displayed at 26 if manual control is desired.

Figure 2:
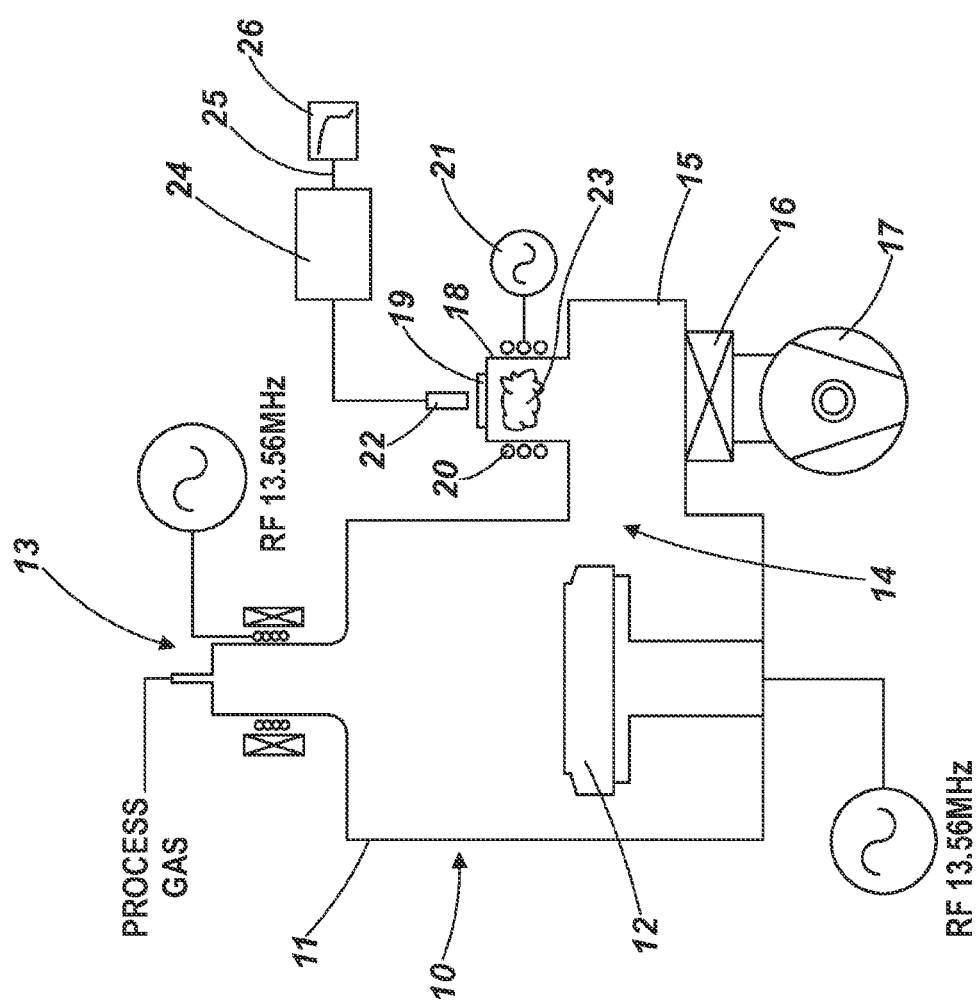
FIG. 2 is a schematic sectional view through the apparatus of FIG. 1.
Figure 3:
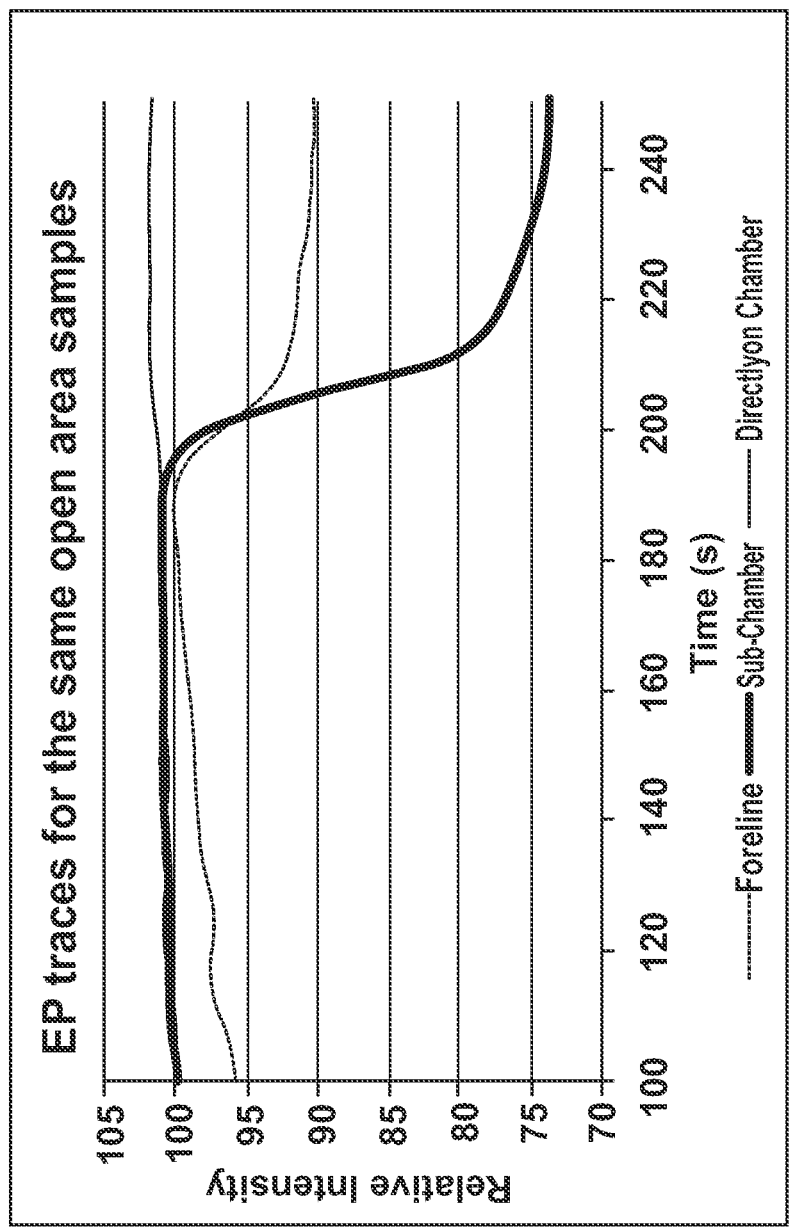
FIG. 3 is a graph of the output of a detector showing the traces for different configurations.

FIG. 3 is a plot of such an output signal for three different experimental arrangements. The process being run was a relatively high pressure plasma etch process and the optical emission relating to a particular etch process in the chamber itself; downstream of the turbo pump and with the apparatus shown in FIG. 2.

As can be seen from FIG. 3 there was no detectable change in the signal within the chamber because in the high pressure situation very little reaction product reaches the plasma. (It should be noted that the graph is of relative intensity not actual intensity).

In the foreline (i.e. downstream of the turbo pump) it takes a little while before the relative intensity reaches 100% and then the drop off in intensity is relatively slow and flat. As the intensity initially rises from below 100%, it is quite difficult to set up the equipment to be sure of detecting an end point until the relative intensity has dropped back down again below this starting position. As can be seen from the graph, this in itself could lead to a delay of some 10 seconds before an end point could be established and the relatively small change means that the system is more susceptible to errors and therefore it may not be possible to be certain of determining an end point until up to 20 seconds later, in terms of the process being utilised in the experiment. In contrast the solid line trace starts at a relative intensity of 100% and drops off very much more sharply allowing accurate and quick end point detection and therefore reduces the risk of undered over-etching. The sensitivity is importantly better because of clearer, larger signal being generated and so even endpoints, which create relatively small changes in the exhaust gas, can be detected. For example, these may result from small exposed open areas.

It will also be appreciated that the system can be used even when the main process does not utilize a plasma and the improved response means that the system can be used with shorter etch processes.

The detector 22 can be any suitable configuration that detects the emissions and issues signals representative of a characteristic of the emissions. It could, for example, be a simple filter in a wide band optical detector, one or more narrow band detectors, such as manual or automatic monochromatographs, or a full spectrometer, such as a CCD (Camera Optical Emissions) Spectrometer.

The window 19 clearly must be transparent to the optical transmission of interest. If the apparatus is very specifically configured, it could even constitute the necessary filter.

The apparatus not only allows good and quick end point detection. It could be used for other testing processes such as gas quality assessment, leak checking and window clouding measurements.

What is claimed is:

1. Apparatus for chemically etching a workpiece using a process gas, the apparatus including:
   a process chamber in which the process gas is received, and having a pumping port comprising an orifice through which exhaust gases are extracted from the process chamber, the process chamber including a main chamber and a sub-chamber;
   a workpiece support located in the main chamber of the process chamber;
   wherein the sub-chamber is located upstream of the pumping port and downstream of the workpiece support with respect to the flow of gas through the apparatus, and the interior of the sub-chamber has a volume smaller than that of the main chamber of the process chamber,
   the sub-chamber has a sub-chamber wall including a first portion and a second portion, the first portion defining a main part of the sub-chamber and carrying the pumping port, and the second portion defining an extension or dead end leading out of the main part of the sub-chamber,
   the orifice has a diameter that is smaller than a diameter of the main part of the sub-chamber, each as taken in the same direction,
   the sub-chamber is devoid of flow controls that regulate the flow of gas from the main portion of the process chamber to the orifice of the pumping port,
   the sub-chamber also has a window in the second portion of the sub-chamber wall, and an excitation source adjacent the window,
   the window is generally opposite the orifice of the pumping port, and
   the excitation source is configured to produce a plasma in the extension or dead end, thereby exciting a sample of the exhaust gases located within the extension or dead end to create an optical emission which can be monitored through the window; and
   a vacuum pump having an inlet connected to the sub-chamber at the pumping port so as to extract gases from the process chamber through the orifice of the pumping port.

2. Apparatus as claimed in claim 1 wherein the second portion of the sub-chamber wall includes a tubular sidewall, and the excitation source includes a coil or capacitor surrounding the tubular sidewall so as to extend around the extension or dead end.

3. Apparatus as claimed in claim 2 further including a detector for monitoring the optical emission visible through the window.

4. Apparatus as claimed in claim 3 further including a control for determining a process end point from the detected optical emission.

5. Apparatus as claimed in claim 3 further including a source of ionized process gas connected to the main chamber of the process chamber so as to supply the ionized process gas into the main chamber.

6. Apparatus as claimed in claim 2 further including a source of ionized process gas connected to the main chamber of the process chamber so as to supply the ionized process gas into the main chamber.

7. Apparatus as claimed in claim 1 further including a detector for monitoring the optical emission visible through the window.

8. Apparatus as claimed in claim 7 further including a source of process gas connected to the main chamber of the process chamber so as to supply the process gas into the main chamber for use in processing a workpiece supported on the workpiece support in the main chamber, and a control for determining an end point of a process being performed on the workpiece, using the process gas, from the detected optical emission.

9. Apparatus as claimed in claim 7 further including a source of ionized process gas connected to the main chamber of the process chamber so as to supply the ionized process gas into the main chamber.

10. Apparatus as claimed in claim 1 further including a source of ionized process gas connected to the main chamber of the process chamber so as to supply the ionized process gas into the main chamber.

11. Apparatus as claimed in claim 1 wherein the first portion of the sub-chamber wall projects laterally from the main chamber, the second portion of the sub-chamber wall projects upwardly from the first portion of the sub-chamber wall such that the extension or dead end is defined at the top of the sub-chamber, and the pumping port is carried by a bottom part of the first portion of the sub-chamber wall so as to be disposed at the bottom of the sub-chamber.

12. Apparatus for chemically etching a workpiece using process gas, the apparatus comprising:
   a process chamber having a main chamber wall delimiting an interior space of a main chamber of the process chamber and having an opening therethrough, a sub-chamber wall integral with the main chamber wall and delimiting an interior space of a sub-chamber of the process chamber, a window in the sub-chamber wall, and an excitation source adjacent the window;
   a pumping port carried by the sub-chamber wall and comprising an orifice through which gas is extracted from the process chamber;
   a workpiece support, on which a workpiece is chemically etched, disposed in the main chamber of the process chamber; and
   a vacuum pump having an inlet connected to the sub-chamber at the pumping port,
   wherein the interior of the sub-chamber has a smaller volume than that of the main chamber of the process chamber,
   the interior of the sub-chamber of the process chamber is in open communication with the interior of the main chamber of the process chamber via the opening upstream of the pumping port such that products of a reaction caused by the etching of a workpiece supported by the workpiece support flow freely from the interior space of the chamber into the interior space of the sub-chamber,
   the sub-chamber wall has a first portion extending from the main chamber wall, and a second portion that extends from the first portion and defines an extension or dead end that is narrower than that part of the sub-chamber constituted by the first portion of the sub-chamber wall,
   the orifice has a diameter that is smaller than a diameter of said part of the sub-chamber constituted by the first portion of the sub-chamber wall, each as taken in the same direction, the window is disposed in the second portion of the sub-chamber wall, the window and the pumping port are disposed across from each other, the excitation source includes a coil or capacitor adjacent and spaced from second portion of the sub-chamber wall outside the extension or dead end, the excitation source is configured to produce a plasma localized in the extension or dead end, and the flow path in the apparatus from the process chamber to the pumping port through the sub-chamber is devoid of flow controls that regulate that flow of gas.

13. Apparatus as claimed in claim 12 further including a detector that monitors optical emissions through the window and is operative to issue signals representative of a characteristic of the optical emissions.

14. Apparatus as claimed in claim 13 further including a control operatively connected to the detector so as to receive the signals representative of the characteristic of the optical emissions and which is configured to determine on the basis of the signals an end point of a process being performed in the main chamber of the process chamber.

15. Apparatus as claimed in claim 12 further including a source of ionized process gas connected to the chamber so as to supply the ionized process gas into the chamber.

16. Apparatus as claimed in claim 12 further including a detector that monitors optical emissions through the window and is operative to issue signals representative of a characteristic of the optical emissions.

17. Apparatus as claimed in claim 16 further including a source of etchant process gas connected to the main chamber of the process chamber so as to supply the etchant process gas into the main chamber for use in chemically etching a workpiece supported on the workpiece support in the main chamber, and a control operatively connected to the detector so as to receive the signals representative of the characteristic of the optical emissions and which is configured to determine on the basis of the signals an end point of a process of chemically etching the workpiece supported by the workpiece support in the main chamber of the process chamber.

* * * * *